(12) United States Patent
Terry

(10) Patent No.: US 6,901,115 B1
(45) Date of Patent: May 31, 2005

(54) COORDINATE INTERLEAVING, AND DEINTERLEAVING, APPARATUS, AND ASSOCIATED METHOD, FOR A COMMUNICATION SYSTEM

(75) Inventor: John Terry, Garland, TX (US)

(73) Assignee: Nokia Corporation, Espoo (FI)

( * ) Notice: Subject to any disclaimer, the term of this patent is extended or adjusted under 35 U.S.C. 154(b) by 460 days.

(21) Appl. No.: 10/085,941

(22) Filed: Feb. 28, 2002

(51) Int. Cl.⁷ .......................... H04L 27/04; H04L 27/06
(52) U.S. Cl. .................... 375/299; 375/267; 375/347; 455/101
(58) Field of Search ................... 375/262, 265, 375/267, 299, 341, 347; 455/101, 103; 714/792, 794, 795

(56) References Cited

U.S. PATENT DOCUMENTS

| 4,945,549 A | * | 7/1990 | Simon et al. | ............... 375/280 |
|---|---|---|---|---|
| 5,553,561 A | | 9/1996 | Schramayr et al. | |
| 5,995,147 A | | 11/1999 | Suzuki | |
| 6,304,581 B1 | | 10/2001 | Chen et al. | |
| 6,445,750 B1 | | 9/2002 | Chen et al. | |

* cited by examiner

*Primary Examiner*—Young T. Tse
(74) *Attorney, Agent, or Firm*—Federico Fraccaroli

(57) ABSTRACT

Apparatus, and associated method, for increasing the diversity levels of data communicated upon a channel susceptible to fading. Trellis-coded modulation is performed upon data to be communicated to form trellis-coded modulated and rotated symbols. Coordinate interleaving is performed by a coordinate interleaver upon selected ones of the modulated and rotated symbols. The coordinate interleaving is performed according to a selected coordinate interleaving scheme responsive to indications of channel conditions upon the communication channel. When delivered to a receiving station, a coordinate deinterleaver deinterleaves the interleaved symbols according to a coordinate deinterleaving scheme that corresponds to the coordinate interleaving scheme.

19 Claims, 4 Drawing Sheets

COORDINATE INTERLEAVING, AND DEINTERLEAVING, APPARATUS, AND ASSOCIATED METHOD, FOR A COMMUNICATION SYSTEM

The present invention relates generally to a manner by which to communicate data upon a communication channel susceptible to fading, or other distortion, in a manner to facilitate recovery of the informational content of the data subsequent to its communication upon the channel. More particularly, the present invention relates to apparatus, and an associated method, for interleaving coordinates of modulated and rotated symbols forming the data at a sending station and for introducing transmit diversity thereon, prior to transmission of the data upon the communication channel. The present invention also further relates to apparatus, and an associated method, for deinterleaving the coordinates of the modulated and rotated symbols, subsequent to reception thereof at a receiving station. Improved diversity levels are provided without appreciably increasing the complexity of operations performed upon the data. When implemented in a communication system utilizing two-dimensional, trellis-coded modulation, diversity levels that otherwise would require a multi-dimensional, trellis-coded modulation scheme are achievable.

BACKGROUND OF THE INVENTION

In a communication system, data is communicated between a sending station and a receiving station by way of a communication channel. The communication channel connects the sending station together with the receiving station. Data, to be communicated by the sending station to the receiving station, is converted into a form to permit its communication upon the communication channel. And, once delivered at the receiving station, the informational content of the data is recovered.

As a result of advancements in communication technologies, many different types of communication systems have been developed, and implemented. And, many different types of communication services are implementable through use of several of the different types of communication systems.

A radio communication system is an exemplary type of communication system. Various radio communication systems permitting various types of communication services to be effectuated therethrough have been developed and implemented.

In a radio communication system, the communication channel that interconnects the sending and receiving stations of the communication system is defined upon a radio link extending between the sending and receiving stations. The radio link is defined upon a portion of the electromagnetic spectrum. Inherent mobility is provided in a radio communication system as the radio link, rather than a conventional wireline connection interconnects the sending and receiving stations. In contrast, a communication system requiring use of conventional wireline connections by which to interconnect sending and receiving stations is generally of limited mobility due to the need to interconnect the sending and receiving stations by the wireline connection.

A cellular communication system is a type of radio communication system that has achieved significant levels of usage in recent years. The networks of various types of cellular communication systems have been installed throughout significant areas of the populated portions of the world. Communications effectuated by way of a cellular communication system are generally effectuated pursuant to a subscription for service in the communication system.

In a cellular communication system, the communication stations form radio transceivers capable both of sending and receiving signals upon communication channels defined upon the radio link extending therebetween. Radio transceivers of a network part of the cellular communication system are referred to as base transceiver stations (BTSs), and radio transceivers carried by subscribers to the system and used by the subscribers to communicate telephonically in the communication system are referred to as mobile stations.

The communication channels upon which data is communicated between a base transceiver station and a mobile station are non-ideal. Distortion is introduced upon the data during its transmission. The distortion is caused, for example, by fading conditions exhibited by the communication channel. If the distortion cannot be adequately compensated for when the data is received at a receiving station, the informational content of the data cannot adequately be recovered.

Various mechanisms are used to reduce the effects of the distortion. For instance, the data that is to be communicated is encoded prior to its communication. Encoding of the data increases its redundancy. When a portion of the data is distorted, a redundant portion of the distorted data might not be so distorted as to prevent its recovery. Creation of physical diversity is sometimes also utilized in an effort to overcome the distortion introduced upon the data during its communication upon the communication channel. Physical diversity is created, for example, through the use of two or more spaced-apart, transmit antennas at which the data is transduced for communication upon the communication channel by way of separate paths thereon.

Interleaving of the data, usually subsequent to encoding thereof, is sometimes also utilized to overcome the effects of distortion. By interleaving the data, distortion affecting a portion of transmitted data is less likely to distort a segment of data that, once deinterleaved at a receiving station, prevents recovery of the informational content thereof. Conventionally, when interleaving is performed, the interleaving is performed upon modulated and rotated symbols of the data. In a trellis-coded modulation (TCM) communication scheme, modulated and rotated symbols are formed of both real and imaginary component parts. Coordinate interleaving of these coordinate parts of the symbols can also be performed. And, increasing the modulation coding of the data that is to be communicated also is used to overcome the distortion introduced upon the data during its communication upon a non-ideal channel.

Generally, a goal is to maximize the coding gain of the data that is to be communicated, best to overcome the effects of distortion while minimizing the computational complexity required to provide the coding gain.

Any manner by which to maintain a selected level of coding gain while requiring only a reduced computational complexity of operations to provide such coding gain would be advantageous.

It is in light of this background information related to the communication of data in a communication system that the significant improvements of the present invention have evolved.

SUMMARY OF THE INVENTION

The present invention, accordingly, advantageously provides apparatus, and an associated method, by which to communicate data upon a communication channel susceptible to fading, or other distortion, in a manner that facilitates recovery of the informational content of the data subsequent to its communication upon the communication channel.

Through operation of an embodiment of the present invention, a manner is provided by which to interleave coordinates of modulated and rotated symbols forming the data at a sending station and for introducing transmit diversity thereon prior to communication upon the communication channel.

Further through operation of an embodiment of the present invention, a manner is provided by which to deinterleave the coordinate-interleaved, modulated and rotated symbols, once received at a receiving station, thereby to permit recreation of the informational content of the transmitted data.

When coordinate interleaving is performed upon the modulated and rotated symbols forming the data to be communicated and transmit diversity is created at the sending station, improved diversity levels are provided without appreciably increasing the complexity of operations performed upon the data. When implemented in a communication system that utilizes two-dimensional, trellis-coded modulation, diversity levels that otherwise would require a multi-dimensional, trellis-coded modulation scheme are achievable. Diversity levels are thereby provided through the use of a two-dimensional trellis code, rather than requiring use of a higher-dimension modulation code.

In one aspect of the present invention, adaptive coordinate interleaving is performed upon modulated and rotated symbols according to a selected coordinate interleaving scheme. Selection of the manner by which the coordinate interleaving is performed, i.e., which modulated and rotated symbols are selected to have their coordinates interleaved, is made responsive to channel state indications representative of communication conditions on the channel upon which the data formed of the symbols are to be communicated. During periods of poor channel conditions, ordered coordinate interleaving are performed. And, when channel conditions are indicated to be good, improving, unreliable, or unknown, block coordinate interleaving is performed.

When the communication system utilizes a time division duplexing (TDD) communication scheme, the channel state information responsive to which adaptive coordinate interleaving decisions are made are determined by analysis of values received at the communication station. Calculations are performed, in one implementation, at the communication station to determine the channel state information. In another implementation, the channel state information is determined elsewhere, and provided to the communication station.

In another aspect of the present invention, spatial diversity is created at a sending station at which the modulated, rotated, coordinate-interleaved symbols are sourced. The spatial diversity is created by the utilization of spaced-apart, transmit antenna transducers to which the modulated, rotated, coordinate-interleaved symbols are provided to be transduced into electromagnetic form. An encoder, such as a Radon-Hurwitz (RH) encoder, or other appropriate encoder, is also utilized to encode the modulated, rotated, coordinate-interleaved symbols prior to their application to the transmit antenna transducers. Through the combination of constellation rotation, coordinate interleaving and creation of transmit diversity, improved levels of diversity are provided, permitting a two-dimensional, trellis code to be utilized to communicate data rather than a more-complex, multi-dimensional trellis code scheme to overcome the effects of fading conditions on a communication channel.

In another aspect of the present invention, a receiving station that receives modulated, rotated, coordinate-interleaved symbols performs a deinterleaving process to coordinate deinterleave the symbols to form deinterleaved, rotated and modulated symbols. The deinterleaved, rotated and modulated symbols are thereafter further operated upon to recover the informational content of the transmitted data. As the coordinate interleaving performed upon the rotated and modulated and rotated symbols is performed responsive to channel state information of the channel conditions of the channel upon which the data is to be communicated, the corresponding deinterleaving procedure is also performed responsive to such channel state information. When the communication system utilizes a time division duplexing scheme, the channel state information is discernible by the receiving station through analysis of the data communicated to the receiving station. Such information is provided, for instance, by the sending station or through independent determination of the channel state conditions.

In an exemplary implementation, adaptive coordinate interleaving of modulated and rotated symbols is performed in a cellular, or other radio, communication system that utilizes two-dimensional, trellis-coded modulation. Adaptive, coordinate interleaving operations are performed for both forward-link communications and for reverse-link communications. And, corresponding coordinate deinterleaving operations are performed to deinterleave both the forward-link and reverse-link data. Thereby, improved levels of diversity are provided without appreciably increasing the complexity of computations required to be performed upon the data that is communicated.

A more complete appreciation of the present invention and to the scope thereof can be obtained from the accompanying drawings that are briefly summarized below, the following detailed description of the presently-preferred embodiments of the invention, and the appended claims.

DETAILED DESCRIPTION

Figure 1:
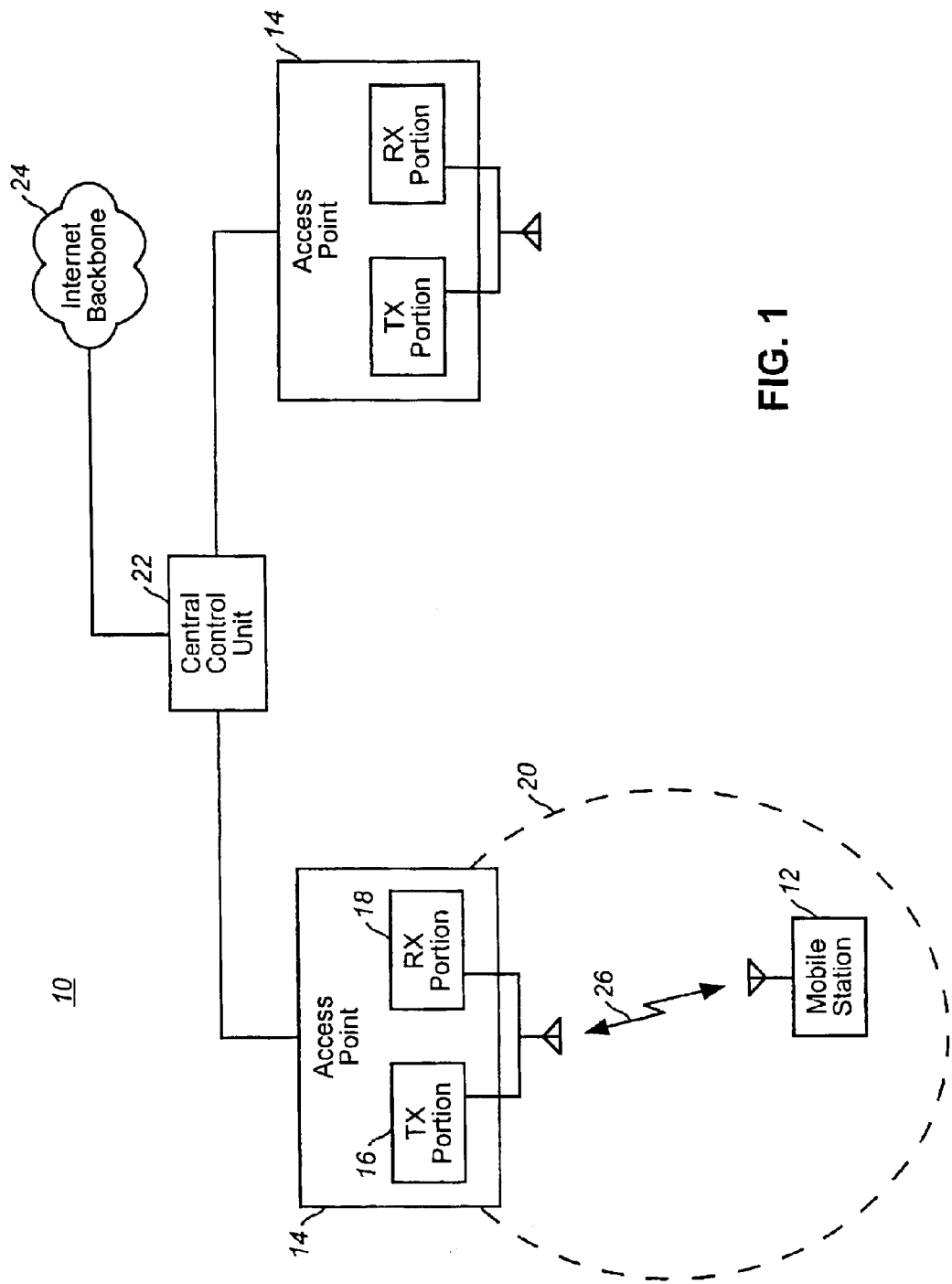
FIG. 1 illustrates a functional block diagram of an exemplary radio communication system in which an embodiment of the present invention is operable.

Referring first to FIG. 1, a radio communication system, shown generally at 10, forms a multi-access communication system permitting a plurality of separate communication sessions to be concurrently effectuated with a plurality of mobile terminals, of which the mobile terminal 12 is exemplary.

In the exemplary implementation, the communication system 10 forms a WLAN (wireless local area network) constructed to be operable pursuant to the IEEE 802.11, or other appropriate, communication standard. While the following description of the exemplary implementation of the present invention shall describe operation of the present invention with respect to its exemplary implementation in which the communication system is formed of such a WLAN, other communication systems can analogously be represented. And, operation of an embodiment of the present invention is analogously also operable in such other communication systems. Description of operation of an embodiment of the present invention, accordingly, is analogous to that described below with respect to its implementation in the WLAN.

The WLAN includes a plurality of spaced-apart access points (APs) 14. In conventional manner, the access points are positioned at spaced-apart locations throughout an area that is to be encompassed by the system. While two access points are shown in the figure, typically, in an actual WLAN, a relatively large number of access points 14 are utilized. An access point is sometimes referred to as being a base station and includes a fixed-site radio transceiver.

In the figure, the access points 14 are shown to include a transmit portion 16 and a receive portion 18 operable to send and receive, respectively, data communicated between the access point and a mobile station to effectuate a communication service during a communication session formed therebetween.

Each access point defines a cell, of which the cell 20 is representative. Generally, if a mobile station 12 is positioned within a cell defined by an access point, when a communication session is formed, communications are effectuated between the mobile station and the access point that defines the corresponding cell. As a mobile station travels between cells defined by successive access points, handoffs of communications between the corresponding, successive access points is performed to permit uninterrupted communications as the mobile terminal moves through the successive cells.

The access points 14 are here shown to be coupled to a central control unit (CCU) 22. The central control unit 22 provides control functions to various aspects of operation of the WLAN. And, as shown, the central control unit provides for connections to an external communication network, here the Internet backbone 24. Other devices, such as computer servers (not separately shown) are connected to the Internet backbone, and communication paths are formable between the connection devices and the mobile terminals. Communications are also effectuated between separate mobile terminals of the WLAN. Communication paths connecting pairs of the mobile terminals include two separate radio links.

The arrow 26 is representative of a radio link formed between an access point 14 and a mobile terminal 12. Communication channels defined upon the radio link regularly exhibit fading conditions that distort the data that is communicated thereon. If the fading conditions are significant, the informational content of the communicated data cannot be recovered.

An embodiment of the present invention provides a coordinate interleaving scheme that operates together with a spatial diversity scheme that together operate to increase the diversity levels of the data communicated upon the radio link, thereby to help combat the effects of fading. A receive portion of the communication pair includes a corresponding coordinate deinterleaving scheme by which to deinterleave the data detected thereat, subsequent to transmission upon the communication channel defined upon the radio link.

Figure 2:
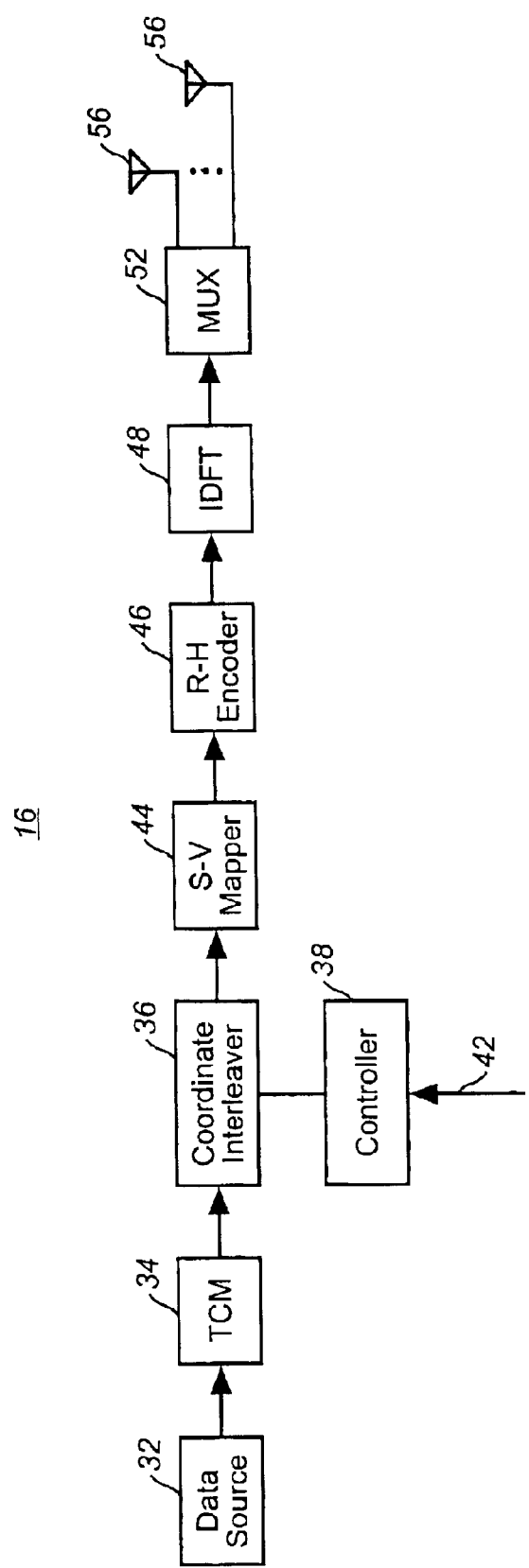
FIG. 2 illustrates a functional block diagram of a sending station that forms a portion of the communication system shown in FIG. 1 and operable pursuant to an embodiment of the present invention.

FIG. 2 illustrates part of the transmit portion 16 that forms a sending station operable to send data upon a communication channel to a receive portion 18 forming a receiving station. The transmit portion forming the sending station is here shown to include a data source 32. The data source sources data that is to be communicated to a receiving station and is representative of any data-type, originated at any location and provided to the transmit portion to be sent therefrom. The data sourced by the data source here is digitized data, forming a bit stream that is applied to a trellis-code modulator and encoder (TCM) 34. The trellis-code modulator and encoder is operable to trellis-code modulate the data applied thereto. In the exemplary implementation, two-dimensional trellis-code modulation is performed. In other implementations, other higher-dimensional trellis-coding is performed. During the trellis-code modulation process, the bits are assigned to symbols of a constellation set.

The modulated and rotated symbols formed by the modulator each include a real coordinate and an imaginary coordinate, and the modulated and rotated symbols are applied to a coordinate interleaver 36. The coordinate interleaver is selectably operable pursuant to an embodiment of the present invention to interleave coordinates of selected modulated and rotated symbols applied thereto according to a coordinate interleaving scheme. A controller 38, coupled to the coordinate interleaver, is functionally representative of the adaptive, and selectable, nature of the coordinate interleaving performable by the coordinate interleaver. The adaptive, coordinate interleaving selected by the controller is dependent upon channel state information representative of channel conditions of the channel defined upon the radio link and upon which data is communicated by the sending station. In the exemplary implementation in which the channels are allocated pursuant to a TDD (time-division duplexing) scheme, the channel state information is determined responsive to data sent to the corresponding receiving portion of the radio transceiver of which the transmit portion forms a part. When the channel state conditions are determined to be poor, ordered coordinate interleaving are introduced by the interleaver 36. And, when communication conditions are determined to be good, unknown, or unreliable, block coordinate interleaving is performed by the interleaver. Good in this content is considered channels where the effects of the distortions are mitigated, diminished or resembling an additive white Gaussian noise (AWGN) channel. Application of the channel state information is here represented by information provided to the controller by way of the line 42.

Once coordinate interleaving has been performed, the coordinate-interleaved symbols selectably formed by the interleaver are provided to a scalar-to-vector (S-V) mapper 44. And, thereafter, vector components are provided to an encoder, here a Radon-Hurwitz (RH) encoder 46. Conventional operation to Radon-Hurwitz encode the values provided thereto is performed in conventional manner. And, thereafter, an inverse discrete Fourier transform performed thereon by an inverse discrete Fourier transformer (IDFT) 48 and multiplexer 52. Spatial diversity is introduced upon the resultant data by applying the data to spaced-apart antenna transducers 56. The data applied to the separate antenna transducers is communicated to a receiving station by way of separate paths to a receiving station.

Figure 3:
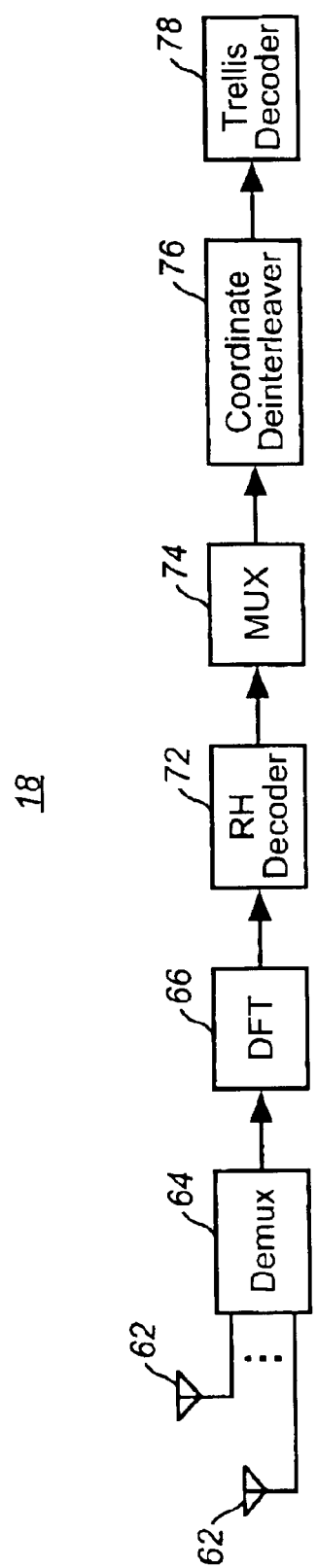
FIG. 3 illustrates a functional block diagram of a receiving station also forming a portion of the communication system shown in FIG. 1 and operable pursuant to an embodiment of the present invention.

FIG. 3 illustrates a receive portion 18 forming a receiving station operable to receive coordinate-interleaved symbols sent thereto by way of a communication channel by a sending station.

In the exemplary implementation, a multiple-receive antenna implementation is utilized. In other implementations, a single antenna construction is utilized. When the data is received, the data is converted into electrical form by the antenna transducer 62, then demultiplexed by a demultiplexer 64 and discrete Fourier-transformed by a discrete Fourier transformer (DFT) 66. Then Radon-Hurwitz (RH) decoding is performed by a Radon-Hurwitz (RH) decoder 72. Decoded values are multiplexed together by a multiplexer 74. And, multiplexed values are provided to a coordinate deinterleaver 76. The coordinate deinterleaver is operable in manners generally reverse to those of the coordinate interleaver 36 of the sending station (shown in FIG. 2) to deinterleave the interleaved symbols provided thereto. Deinterleaved symbols formed by the deinterleaver are provided to a trellis decoder 78 which performs trellis decoding operations corresponding to the trellis coding operations performed by the modulator 34 (shown in FIG. 2).

In one implementation, when coordinate interleaving is to be performed by the coordinate interleaver of the sending station, selection is made of which coordinates to interleave. As the symbols are formed of both real and imaginary component portions, real component coordinates of selected ones of the symbols are interleaved with corresponding real coordinates of other symbols. And, imaginary coordinate values of other selected symbols are interleaved with other imaginary coordinates of other symbols.

When two-dimensional trellis-coded modulation is performed to form two-dimensional, trellis-coded symbols, the following coordinate interleaving scheme is utilized. The channel conditions are represented by a frequency domain representation, $H(k)$, and complex data symbols, $S(k)$, represent the modulated and rotated symbols provided to the coordinate interleaver. The ordered coordinate interleaving procedure is as follows:

1. Define $c=|H(k)|$ or $|H(k)|^2$
2. Find sort index ii that orders c in term of weakest to strongest
3. $S_r(k)=real(S(k))=imaginary(S(k))$
4. $SS_r(k)=S_r(ii)$; $SS_i(k)=(S_i(reverse(ii)))$, where reverse([1 2 3])=[3 2 1];
5. $SS=SS_r+j*SS_i$ To perform ordered coordinate deinterleaving operations, operations generally reverse to those shown just-above, are performed. For maximum likelihood decoding, the relative reliability of each coordinate must be passed to a Viterbi decoder. This is performed as follows:

$m_r(ii)=c$ $m_i(reverse(ii))=c$

And, more generally, for a multi-dimensional modulation scheme having k-dimensional constellations in which k is greater than or equal to 2, the following ordered interleaving procedure is utilized:

1. Define $pp=\lceil k/2 \rceil$, where $\lceil x \rceil$ is the smallest integer greater than or equal to x
2. Let N=length(c) and N be even and rotate ([1 2 3 4 5],2)=[4 5 1 2 3]
3. Loop from mm=1:pp
4. ii=rotate(ii, N/mm). Note ii=rotate(ii,N) when length (ii)=N
5. Perform the interleaving procedure for pair of coordinates as stated earlier until all coordinates have been interleaved.

Figure 4:
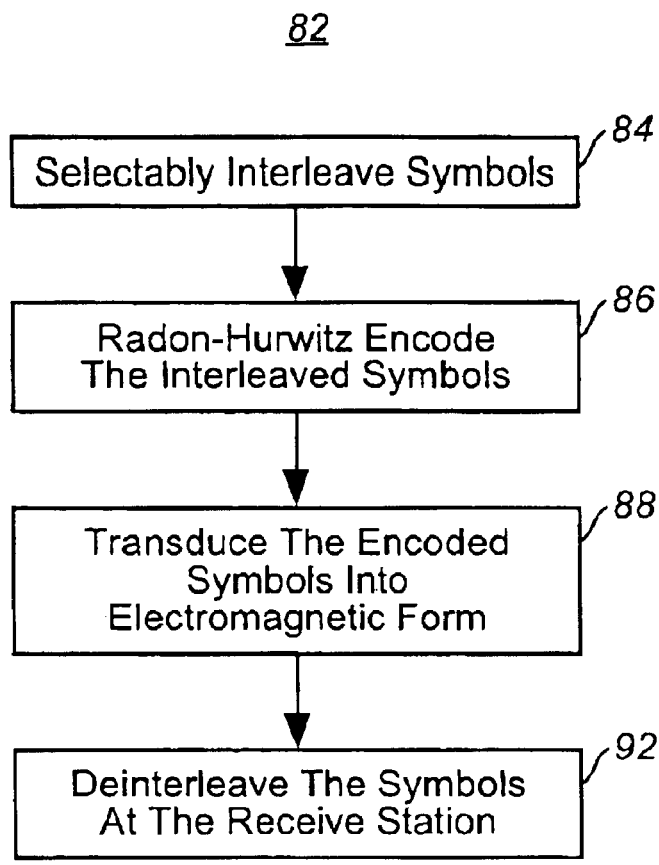
FIG. 4 illustrates a method flow diagram listing the method steps of the method of operation of an embodiment of the present invention.

FIG. 4 illustrates a method flow diagram, shown generally at 82, for converting send data into a form to facilitate communication thereof upon a communication channel. First, and as indicated by the block 84, coordinates of modulated and rotated symbols formed at the sending station are selectably interleaved. The coordinates are interleaved pursuant to a selected interleaving scheme to form interleaving symbols therefrom. Then, and as indicated by the block 86, the interleaved symbols are Radon-Hurwitz encoded to form Radon-Hurwitz encoded symbols. Then, the Radon-Hurwitz encoded symbols are transduced at first and at least second spaced-apart antenna transducers into electromagnetic form, as indicated by the block 88, thereby to send the interleaved symbols upon the communication channel.

Thereafter, and as indicated by the block 92, once received at a receiving station, the coordinates of the interleaved symbols are deinterleaved. Deinterleaving is performed pursuant to a selected deinterleaving scheme in which the selected deinterleaving scheme corresponds to the selected interleaving scheme.

Thereby, through operation of an embodiment of the present invention, improved diversity levels are provided for data communicated upon a channel susceptible to fading. The improved diversity levels are provided without appreciably increasing the computational complexity of the data.

The previous descriptions are of preferred examples for implementing the invention, and the scope of the invention should not necessarily be limited by this description. The scope of the present invention is defined by the following claims:

What is claimed is:

1. Apparatus for a sending station of a communication system at which send data is sent upon a communication susceptible to fading, the send data formed of data symbols, each data symbol having a real coordinate and an imaginary coordinate, said apparatus for the sending station for converting the send data into a form to facilitate communication thereof upon the communication channel, said apparatus comprising:

a coordinate interleaver adapted to receive the data symbols, said coordinate interleaver selectably for interleaving coordinates of the data symbols according to a selected interleaving scheme to form interleaved symbols, such that for a selected data symbol, a real coordinate thereof is interleaved with a real coordinate of a first data symbol, and an imaginary coordinate is interleaved with an imaginary coordinate of an other than said first data symbol; and a controller coupled to said coordinate interleaver and adapted to receive indications of a channel condition of the communication channel, said controller selectably for causing operation of said coordinate interleaver, said controller for causing the operation of said coordinate interleaver when the channel condition is poorer than a selected threshold.

2. The apparatus of claim 1 further comprising a transmit diversity creator coupled to receive indications of the interleaved symbols formed by said coordinate interleaver, said transmit diversity creator operable pursuant to a transmit diversity scheme to cause the interleaved symbols, when sent upon the communication channel to exhibit transmit diversity.

3. The apparatus of claim 2 wherein the transmit diversity scheme comprises a space diversity scheme, and wherein said transmit diversity creator comprises a space diversity creator to cause interleaved symbols, when communicated upon the communication channel, to exhibit space diversity.

4. The apparatus of claim 3 wherein said space diversity creator comprises a Radon-Hurwitz encoder.

5. The apparatus of claim 4 wherein said space diversity creator further comprises a first transmit antenna and at least a second transmit antenna spaced-apart therefrom, the first and at least second transmit antennas, respectively, coupled to the Radon-Hurwitz encoder, the first transmit antenna for transmitting a first data stream formed of selected interleaved symbol coordinates and the second transmit antenna for transmitting a second data stream also formed of the selected interleaved symbol coordinates.

6. The apparatus of claim 1, wherein the data symbols to which said coordinate interleaver is coupled to receive comprise trellis coded modulated and rotated symbols.

7. The apparatus of claim 6 wherein the trellis coded modulated and rotated symbols to which said coordinate interleaver is coupled to receive comprise two-dimensional trellis coded modulated and rotated symbols.

8. The apparatus of claim 1 wherein the channel condition to which said controller is adapted to receive is determined at the sending station.

9. The apparatus of claim 8 wherein the send data sent upon the communication channel by the sending station is sent to a receiving station, wherein the receiving station and the sending station are capable of two-way communications, the receiving station further for sending receive-station data to the sending station, and wherein determinations made of the channel condition made at the sending station is made responsive to indications of the receive-station data sent to the sending station.

10. The apparatus of claim 9 wherein the communication system is operable pursuant to a time division duplexing scheme wherein the send data and the receiving-station data are sent within a common frequency band.

11. The apparatus of claim 1 wherein the send data sent upon the communication channel by the sending station is sent to a receiving station, wherein the receiving station and the sending station are capable of two-way communications, the receiving station further for sending receive-station data to the sending station, and wherein determinations made at the sending station of the channel condition is made at the receiving station and provided to the sending station as part of the receive-station data.

12. The apparatus of claim 1 wherein the communication system further comprises a receiving station for receiving the send data formed of the interleaved symbols, said apparatus further at the receiving station for operating upon the sending data, once received thereat, said apparatus further comprising:
a coordinate deinterleaver coupled to receive indications of the interleaved symbols forming the send data, said coordinate deinterleaver selectably for deinterleaving the at least selected coordinates of the interleaved symbols according to a selected deinterleaving scheme, the selected deinterleaving scheme corresponding to the selected interleaving scheme.

13. The apparatus of claim 12 wherein the send data is sent as a first data stream and at least a second data stream pursuant to a space diversity scheme by the sending station, said apparatus further comprising a coordinate combiner coupled to receive representations of the send data, said coordinate combiner for selectably combining representations of the symbols forming the send data, the representations of the symbols, once combined, forming the indications of the interleaved symbols applied to said coordinate deinterleaver.

14. The apparatus of claim 13 wherein said coordinate deinterleaver forms deinterleaved coordinates, said apparatus further comprising a decoder to which the deinterleaved coordinates are applied, said decoder for decoding the deinterleaved coordinates.

15. A method of communicating in a communication system having a sending station at which send data is sent upon a communication channel susceptible to fading, the send data formed of data symbols, each data symbol having a real coordinate and an imaginary coordinate, said method for the sending station for converting the send data into a form to facilitate communication thereof upon the communication channel said method comprising:
selectably interleaving coordinates of modulated and rotated symbols formed at the sending station, the coordinates interleaved pursuant to a selected interleaving scheme to form interleaved symbols therefrom in which, for a selected data symbol, a real coordinate thereof is interleaved with a real coordinate of a first data symbol and an imaginary coordinate is interleaved with an imaginary coordinate of an other than said first data symbol; and
determining whether a channel condition upon the communication channel is poorer than a selected threshold; if so, then
sending the interleaved symbols upon the communication channel utilizing a transmit diversity scheme.

16. The method of claim 15 wherein said operation of sending comprises:
Radon-Hurwitz encoding the interleaved symbols to form Radon-Hurwitz encoded symbols; and
transducing the Radon-Hurwitz encoded symbols at first and at least second spaced-apart antenna transducers into electromagnetic form for communication upon the communication channel.

17. The method of claim 15 wherein the send data is communicated to a receiving station and wherein said method further comprises the operation, at the receiving station, of:
deinterleaving coordinates of the interleaved symbols once received at the receiving station pursuant to a selected deinterleaving scheme, the selected deinterleaving scheme corresponding to the selected interleaving scheme.

18. The method of claim 15 further comprising the operation, prior to said operation of selectably interleaving, of trellis-code modulating the send data to form the modulated and rotated symbols.

19. The method of claim 18 wherein the modulated and rotated symbols formed during said operation of trellis-code modulating comprise two dimensional, trellis-coded modulated and rotated symbols.

* * * * *